United States Patent
Forbes et al.

(10) Patent No.: US 6,456,535 B2
(45) Date of Patent: *Sep. 24, 2002

(54) DYNAMIC FLASH MEMORY CELLS WITH ULTRA THIN TUNNEL OXIDES

(75) Inventors: Leonard Forbes, Corvallis, OR (US); Luan C. Tran, Meridian, ID (US); Alan R. Reinberg, Westport, CT (US); Joseph E. Geusic, Berkeley Heights, NJ (US); Kie Y. Ahn, Chappaqua, NY (US); Paul A. Farrar, So. Burlington, VT (US); Eugene H. Cloud, Boise, ID (US); David J. McElroy, Livingston, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/882,920

(22) Filed: Jun. 15, 2001

Related U.S. Application Data

(63) Continuation of application No. 09/513,938, filed on Feb. 28, 2000, now Pat. No. 6,249,460.

(51) Int. Cl.$^7$ .............................................. G11C 16/04
(52) U.S. Cl. ............................ 365/185.28; 365/185.26; 365/185.14
(58) Field of Search ....................... 365/185.28, 185.26, 365/185.01, 185.14, 185.21, 161

(56) References Cited

U.S. PATENT DOCUMENTS

| | | | |
|---|---|---|---|
| 3,387,286 A | 6/1968 | Dennard | 340/173 |
| 3,882,469 A | 5/1975 | Gosney, Jr. | 340/173 R |
| 4,173,766 A | 11/1979 | Hayes | 357/23 |

(List continued on next page.)

OTHER PUBLICATIONS

Chen, I., et al., "A Physical Model for the Gate Current Injection in p–Channel MOSFET's", *IEEE Electron Device Letters*, 14(5), 228–230, (May 1993).

Chen, J., et al., "Hot Electron Gate Current and Degradation in P–Channel SOI MOSFET's", *1991 IEEE International SOI Conference Proceedings*, Vail Valley, Colorado, pp. 8–9, (Oct. 1991).

(List continued on next page.)

*Primary Examiner*—David Nelms
*Assistant Examiner*—Thong Le
(74) *Attorney, Agent, or Firm*—Schwegman, Lundberg, Woessner & Kluth, P.A.

(57) ABSTRACT

Structures and methods involving n-channel flash memories with an ultrathin tunnel oxide thickness, have been provided. Both the write and erase operations are performed by tunneling. According to the teachings of the present invention, the n-channel flash memory cell with thin tunnel oxides will operate on a dynamic basis. The stored data can be refreshed every few seconds as necessary. However, the write and erase operations will however now be orders of magnitude faster than traditional n-channel flash memory and the cell provides a large gain. The present invention further provides structures and methods for n-channel floating gate transistors which avoid n-channel threshold voltage shifts and achieve source side tunneling erase. The n-channel memory cell structure includes a floating gate separated from a channel region by an oxide layer of less than 50 Angstroms (Å). According to the teachings of the present invention, the floating gate is adapted to hold a charge of the order of $10^{-17}$ Coulombs at for at least 1.0 second at 85 degrees Celsius. The method includes applying a potential of less than 3.0 Volts across the floating gate oxide which is less than 50 Angstroms, in order to add or remove a charge from a floating gate. The method further includes reading the n-channel memory cell by applying a potential to a control gate of the n-channel memory cell of less than 1.0 Volt.

93 Claims, 7 Drawing Sheets

U.S. PATENT DOCUMENTS

| | | | | |
|---|---|---|---|---|
| 4,409,723 A | * | 10/1983 | Harari | 29/571 |
| 4,435,785 A | | 3/1984 | Chapman | 365/147 |
| 5,020,030 A | | 5/1991 | Huber | 365/185 |
| 5,596,214 A | | 1/1997 | Endo | 257/324 |
| 5,740,104 A | | 4/1998 | Forbes | 365/185.03 |
| 5,754,477 A | | 5/1998 | Forbes | 365/185.33 |
| 5,768,193 A | | 6/1998 | Lee et al. | 365/185.25 |
| 5,790,455 A | | 8/1998 | Caywood | 365/185.96 |
| 5,796,670 A | | 8/1998 | Liu | 365/228 |
| 5,801,401 A | | 9/1998 | Forbes | 257/77 |
| 5,811,865 A | | 9/1998 | Hodges et al. | 257/411 |
| 5,886,368 A | | 3/1999 | Forbes et al. | 257/77 |
| 6,008,091 A | * | 12/1999 | Gregor et al. | 438/261 |
| 6,011,725 A | * | 1/2000 | Eitan | 365/185.33 |
| 6,025,627 A | | 2/2000 | Forbes et al. | 257/321 |
| 6,031,263 A | | 2/2000 | Forbes et al. | 257/315 |
| 6,063,668 A | | 5/2000 | He et al. | 438/264 |
| 6,096,640 A | | 8/2000 | Hu | 438/652 |
| 6,249,460 B1 | * | 6/2001 | Forbes et al. | 365/185.28 |
| 6,319,774 B1 | * | 12/2001 | Hai | 438/259 |

OTHER PUBLICATIONS

Chung, S.S., et al., "Performance and Reliability Evaluations of P–Channel Flash Memories with Different Programming Schemes", *International Electron Devices Meeting, Technical Digest*, Washington, D.C., 295–298, (Dec. 1997).

Dipert, B., et al., "Flash Memory Goes Mainstream", *IEEE Spectrum, 30*, 48–52, (Oct. 1993).*

Ghodsi, R., et al., "Gate–Induced Drain–Leakage in Buried–Channel PMOS–A Limiting Factor in Development of Low–Cost, High–Performance 3.3–V, 0.25–um Technology", *IEEE Electron Device Letters, 19(9)*, 354–356, (Sep. 1998).*

Ohnakado, T., et al., "1.5V Operation Sector–Erasable Flash Memory with BIpolar Transistor Selected (BITS) P–Channel Cells", *1998 Symposium on VLSI Technology; Digest of Technical Papers*, 14–15, (1998).*

Ohnakado, T., et al., "Novel Electron Injection Method Using Band–to–Band Tunneling Induced Hot Electron (BBHE) for Flash Memory with a P–Channel Cell", *1995 International Electron Devices Meeting Technical Digest*, Washington D.C.,, pp. 279–282, (1995).*

Ohnakado, T., et al., "Novel Self–Limiting Program Scheme Utilizing N–Channel Select Transistors in P–Channel DINOR Flash Memory", *1996 International Electron Devices Meeting Technical Digest*, San Francisco, CA, pp. 181–184, (1996).*

Papadas, C., et al., "Modeling of the Intrinsic Retention Charcteristics of FLOTOX EEPROM Cells Under Elevated Temperature Conditions", *IEEE Transaction on Electron Devices, 42*, 678–682, (Apr. 1995).*

Patel, N. K., et al., "Stress–Induced Leakage Current in Ultrathin SiO2 Films", *Appl. Phys. Letters, 64(14)*, 1809–1811, (Apr. 1994).*

Salm, C., et al., "Gate Current and Oxide Reliability in p+ Poly MOS Capacitors with Poly–Si and Poly–Ge0.3Si0.7 Gate Material", *IEEE Electron Device Letters 19(7)*, 213–215, (Jul. 1998).*

Shi, Y., et al., "Tunneling Leakage Current in Ultrathin (<4 nm) Nitride/Oxide Stack Dielectrics", *IEEE Electron Device Letters, 19(10)*, pp. 388–390, (Oct. 1998).*

Wu, Y., et al., "Time Dependent Dieletric Wearout (TDDW) Technique for Reliability of Ultrathin Gate Oxides", *IEEE Electron Device Letters, 20(6)*, 262–264, (Jun. 1999).*

* cited by examiner

DYNAMIC FLASH MEMORY CELLS WITH ULTRA THIN TUNNEL OXIDES

CROSS REFERENCE TO RELATED APPLICATIONS

This application is a Continuation of U.S. application Ser. No. 09/513,938, filed Feb. 28, 2000 now is U.S. Pat. No. 6,249,460.

This application is related to the following co-pending, commonly assigned U.S. patent applications: "P-Channel Dynamic Flash Memory Cells with UltraThin Tunnel Oxides," Ser. No. 09/514,627, which is filed on even date herewith.

FIELD OF THE INVENTION

The present invention relates generally to integrated circuit technology and, more particularly, to structures and methods involving n-channel flash memory cells with ultrathin tunnel oxides.

BACKGROUND OF THE INVENTION

The use of the one device cell, invented by Dennard in 1967 (see generally, U.S. Pat. No. 3,387,286, issued to R. H. Dennard on Jun. 4, 1968, entitled "Field Effect Transistor memory"), revolutionized the computer industry, by significantly reducing the complexity of semiconductor memory. This enabled the cost, of what was then a scarce commodity, to be drastically reduced.

Today, dynamic random access memories (DRAMs) are a mainstay in the semiconductor industry. DRAMs are data storage devices that store data as charge on a storage capacitor. A DRAM typically includes an array of memory cells. Each memory cell includes a storage capacitor and an access transistor for transferring charge to and from the storage capacitor. Each memory cell is addressed by a word line and accessed by a bit line. The word line controls the access transistor such that the access transistor controllably couples and decouples the storage capacitor to and from the bit line for writing and reading data to and from the memory cell. Current DRAM technology generally requires a refreshing of the charge stored on the storage capacitor where the charge must be refreshed every so many milliseconds.

Over the course of time what was a very simple device (a planer capacitor and one transistor) has, because of even shrinking dimensions, become a very complex structure to build. Whether it is the trench capacitor, favored by IBM, or the stacked capacitor, used by much of the rest of the industry, the complexity and difficulty has increased with each generation. Many different proposals have been proposed to supplant this device, but each has fallen short because of either the speed of the write or erase cycle being prohibitively long or the voltage required to accomplish the process too high. One example of the attempt to supplant the traditional DRAM cell is the so-called electrically erasable and programmable read only memory (EEPROM), or more common today, flash memory.

Electrically erasable and programmable read only memories (EEPROMs) provide nonvolatile data storage. EEPROM memory cells typically use field-effect transistors (FETs) having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. The charge is placed on the floating gate during a write operation using a technique such as hot electron injection or Fowler-Nordheim (FN) tunneling. Fowler-Nordheim tunneling is typically used to remove charge from the polysilicon floating gate during an erase operation. A flash EEPROM cell has the potential to be smaller and simpler than a DRAM memory cell. One of the limitations to shrinking a flash EEPROM memory cell has been the requirement for a silicon dioxide gate insulator thickness of approximately 10 nm, or 100 Å, between the floating polysilicon gate and the silicon substrate forming the channel of a flash field effect transistor. This gate thickness is required to prevent excess charge leakage from the floating gate that would reduce data retention time (targeted at approximately 10 years)

Current n-channel flash memories utilize a floating polysilicon gate over a silicon dioxide gate insulator of thickness of the order 100 Å or 10 nm in a field effect transistor. (See generally, B. Dipert et al., *IEEE Spectrum*, pp. 48–52 (October 1993). This results in a very high barrier energy of around 3.2 eV for electrons between the silicon substrate and gate insulator and between the floating polysilicon gate and silicon oxide gate insulator. This combination of barrier height and oxide thickness results in extremely long retention times even at 250 degrees Celsius. (See generally, C. Papadas et al., *IEEE Trans. on Electron Devices*, 42, 678–681 (1995)). The simple idea would be that retention times are determined by thermal emission over a 3.2 electron volt (eV) energy barrier, however, these would be extremely long so the current model is that retention is limited by F–N tunneling off of the charged gate. This produces a lower "apparent" activation energy of 1.5 eV which is more likely to be observed. Since the retention time is determined either by thermal excitation of electrons over the barrier or the thermally assisted F–N tunneling of electrons through the oxide, retention times are even longer at room temperature and/or operating temperatures and these memories are for all intensive purposes non-volatile and are also known as non-volatile random access memories (NVRAMs). This combination of barrier height and oxide thickness tunnel oxide thickness is not an optimum value in terms of transfer of electrons back and forth between the substrate and floating gate and results in long erase times in flash memories, typically of the order of milliseconds. To compensate for this, a parallel erase operation is performed on a large number of memory cells to effectively reduce the erase time, whence the name "flash" or "flash EEPROM" originated since this effective erase time is much shorter than the erase time in EEPROMs.

Certain approaches to reduce the long erase times in conventional n-channel flash memory cells have been described. These approaches describe the use of reduced barriers between the substrate and polysilicon floating gate and gate insulator by using a different gate insulator rather than silicon dioxide; or using a material other than polysilicon for the floating gate to reduce the barrier between the floating gate and gate insulator. Other structures and methods, disclosed previously to increase the tunneling current and reduce the erase time, have included the use of roughened silicon surfaces under the tunnel oxide to locally increase electric fields.

However, there is yet a need in the art to develop a generalized method for modifying n-channel floating gate transistors such that the same can usefully be implemented in deep sub-micron CMOS technology devices, i.e. which can replace DRAM cells in CMOS technology devices. That is, it is desirable to develop n-channel floating gate transistors which are more responsive, providing faster write and erase times while still maintaining a long life cycle. It is desirable that such n-channel floating gate transistors scale with the shrinking design rules and lower operating voltages in CMOS technology. And, it is further desired that any required refreshing, as ordinarily required in DRAM cells to restore a charge to the memory cell, have an increased refreshing time interval of greater than millisecond intervals.

SUMMARY OF THE INVENTION

The structures and methods described in the present invention include the utilization of dynamic, "enhancement mode," n-channel flash memories with an ultrathin tunnel oxide thickness and the operation of the memory cells on a tunnel-tunnel basis. Both the write and erase operations are performed by tunneling. Since the tunneling current is not only a function of the applied electric fields but is also an exponential function of the tunnel oxide thickness, thinner gate tunnel oxides will reduce the write and erase operations by orders of magnitude. Thinner tunnel oxides will also result in reduced retention times since the thinner oxides will result in increased thermally assisted tunneling of electrons off the floating polysilicon charge storage gate. According to the teachings of the present invention, a n-channel flash memory with thin tunnel oxides will operate on a dynamic basis, the stored data can be refreshed every few seconds vs. every few milliseconds for a conventional DRAM and the write and erase operations will be orders of magnitude faster than conventional flash memory. In this respect then, the n-channel flash memory now operates in a manner equivalent to DRAMs, except there is no longer a requirement for large stacked storage capacitors or deep trench storage capacitors. The large capacitors are unnecessary since the cell now is active in nature and the transistor provides a large gain.

According to one embodiment of the present invention, a n-channel memory cell is provided. The n-channel memory cell includes a control gate. A floating gate is separated from the control gate by a dielectric layer. An oxide layer of less than 50 Angstroms (Å) separates the floating gate from an n-channel region separating a source and a drain region in a substrate. According to the teachings of the present invention, the floating gate is adapted to hold a charge of the order of $10^{-17}$ Coulombs at for at least 1.0 second at 85 degrees Celsius. The n-channel memory cell of the present invention also possesses a longer life cycle than that formerly achieved with conventional flash n-channel memory cells.

According to another embodiment of the present invention, a method for operating a n-channel memory cell is provided. The method includes applying a potential of less than 3.0 Volts across a floating gate oxide which is less than 50 Angstroms, in order to add or remove a charge from a floating gate. The method further includes reading the n-channel memory cell by applying a potential to a control gate of the n-channel memory cell of less than 1.0 Volt. According to the teachings of the present invention, the n-channel memory cell operates on a dynamic basis but the time interval for the required refreshing process is increased from milliseconds to seconds.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
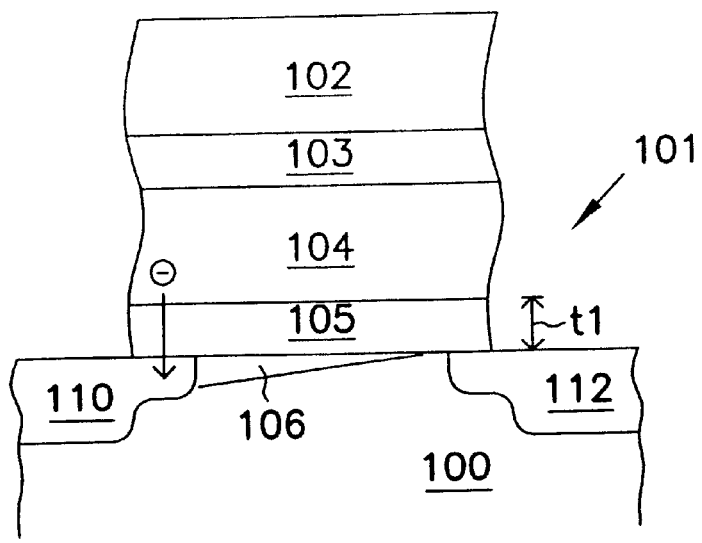
FIG. 1A illustrates a n-channel flash memory cell having a floating gate oxide of less than 50 Angstroms according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The technique described here is the utilization of n-channel flash memories with an ultrathin tunnel oxide thickness and the operation of the memory cells on a tunnel-tunnel basis. Both the write and erase operations are performed by tunneling. Since the tunneling current is not only a function of the applied electric fields but is also an exponential function of the tunnel oxide thickness, thinner gate tunnel oxides will reduce the write and erase operations by orders of magnitude. Thinner tunnel oxides will also result in reduced retention times since the thinner oxides will result in increased thermally assisted tunneling of electrons off the floating polysilicon charge storage gate. An n-channel flash memory with thin tunnel oxides will operate on a dynamic basis, the stored data can be refreshed every few seconds as necessary; the write and erase operations will however now be orders of magnitude faster. In this respect then, the device now operates in a manner equivalent to DRAMs, except there is no longer a requirement for large stacked storage capacitors or deep trench storage capacitors. The large capacitors are unnecessary since the cell now is active in nature and the transistor provides a large gain.

FIG. 1A illustrates a n-channel flash memory cell 101, or n-channel static device 101, having a floating gate oxide of less than 50 Angstroms according to the teachings of the present invention. The n-channel flash memory cell 101 includes a n-channel transistor. As shown in FIG. 1A, the n-channel flash memory cell 101 of the present invention includes a control gate 102 and a floating gate 104. The control gate 102 is separated from the floating gate 104 by an intergate dielectric layer, or intergate oxide 103. In one embodiment the intergate dielectric layer 103 includes a layer of silicon dioxide ($SiO_2$). In an alternative embodiment, the intergate dielectric layer 103 includes a silicon nitride layer ($Si_3N_4$) or any other suitable dielectric layer 103, the invention is not so limited.

FIG. 1A illustrates that the floating gate 104 is separated by an oxide layer, or tunnel gate oxide 105, from a channel region 106. The channel region separates a source region 110 from a drain region 112 in a substrate 100. As one of ordinary skill in the art will understand upon reading this disclosure the source and drain regions, 110 and 112 respectively, include n-type doped source and drain regions, 110 and 112. The n-type doped source and drain regions, 110 and 112, can include heavily doped (n+) source and drain regions, 110 and 112. The substrate includes an p-type substrate or p-well 100.

According to the teachings of the present invention, the oxide layer 105 is an oxide layer which has a thickness (t1) of less than 50 Angstroms (Å). In one embodiment of the present invention, the oxide layer is approximately 30 Angstroms (Å). In one exemplary embodiment of the present invention, the oxide layer is approximately 23 Angstroms (Å).

Figure 1B:
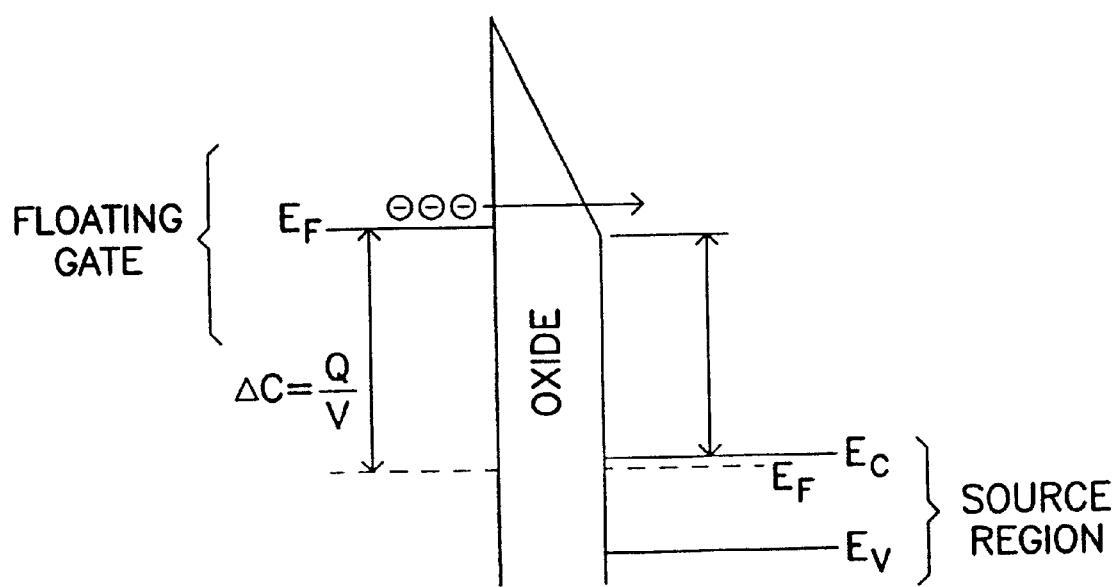
FIG. 1B is an energy band diagram which illustrates generally the F–N tunneling of stored electrons off of the floating gate to the source region as can be used according to the teachings of the present invention.

FIG. 1B is an energy band diagram which illustrates generally the F–N tunneling of stored electrons off of the floating gate to the source region as used in the n-channel flash memory cell according to the teachings of the present invention. One of ordinary skill in the art will understand that this operation occurs when a sufficiently negative potential is applied to the floating gate 104.

Figure 2A:
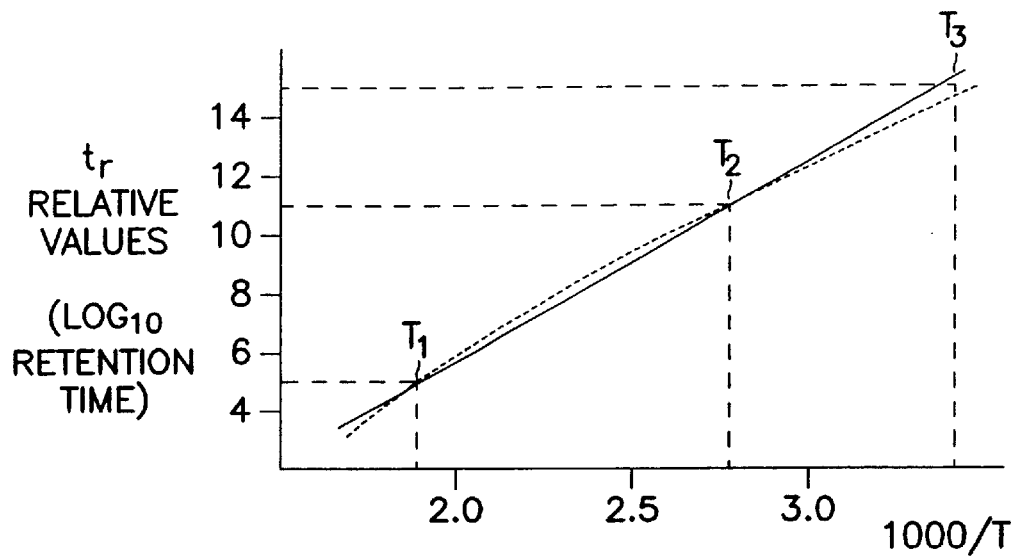
FIGS. 2A and 2B are graphs that illustrate generally the temperature dependence and the dependence of the retention time on gate tunneling oxide thickness based on an extension of published data.
Figure 2B:
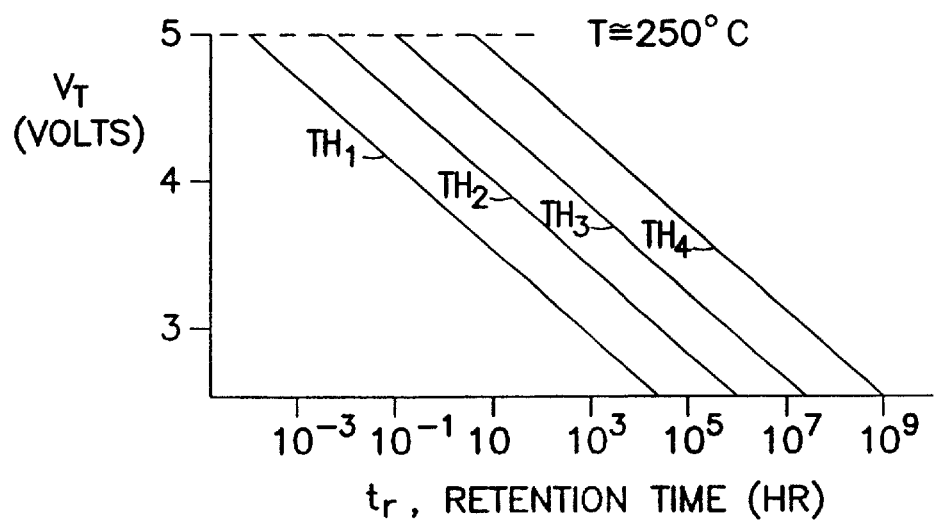

FIGS. 2A and 2B provide an estimate of the temperature dependence and the dependence of the retention time on gate tunneling oxide thickness based on an extension of published data as disclosed in C. Papadas et al., *IEEE Trans. on Electron Devices*, vol. 42, 678–681 (April 1995). In FIG. 2A the X-axis represents normalized inverse temperature (1000/T) and the Y-axis represents the retention time (tr) relative values in log base 10 (log10). Thus, in FIG. 2A temperature T1 is approximately 250 degrees Celsius, temperature T2 is approximately 85 degrees Celsius, and temperature T3 is approximately 27 degrees Celsius. From this published data the temperature dependance of the retention time (tr) can be given by:

$$tr\ e^{(\Delta E/kT)}$$

where $\Delta E$ is the activation energy of the process in the gate oxide, k is the Boltzmann constant, and T is temperature. Using the graph shown in FIG. 2A and the above formula, the change in the order of magnitude of the retention time (tr) for the various temperatures shown can be determined.

FIG. 2B is a graph of threshold voltage (VT) vs retention time (tr) in hours calculated at a temperature of approximately 250 degrees Celsius. The graph illustrates the retention time (tr) as a function of threshold voltage (VT) for a number of different tunnel gate oxide thicknesses (TH). In FIG. 2B, TH1 represents a gate oxide thickness of approximately 60 Angstroms (A), TH2 represents a gate oxide thickness of approximately 70 Angstroms (A), TH3 represents a gate oxide thickness of approximately 80 Angstroms (A), TH4 represents a gate oxide thickness of approximately 90 Angstroms (A). Further calculations can be made based on an extension of the published data represented in FIGS. 2A and 2B.

From FIG. 2B, the retention time (tr), at a temperature of 250 degrees Celsius and an applied potential of 2.5 Volts across the gate oxide, can be expressed as a function of the tunnel gate oxide thickness (tox) by the formula:

$$tr\ 10^{18.65} \times e^{(-2000/tox\ (Å))}$$

where $10^{18.65}$ and $e^{(-2000/tox\ (Å))}$ are constants derived to fit the data for the various gate oxide thicknesses shown on the graph. Using this formula, the retention time (tr) can be calculated for a number of different gate oxide thicknesses. Thus, for a gate oxide having a thickness of 3 nm or 30 Å, when the temperature is 250 at degrees Celsius and a potential of 2.5 Volts is applied across the gate oxide, the retention time (tr) is approximately $10^{-10}$ hours. From an extension of the published data shown in FIGS. 2A and 2B and using the formulas for tr derived from these graphs, tr can similarly be calculated when a potential of 2.5 Volts is applied across a 30 Å thick gate oxide at other temperatures. That is, a value for tr was calculated when a potential of 2.5 Volts is applied across a 30 Å thick gate at a temperature of 250 degrees Celsius. The change in the order of magnitude of the retention time (tr) for different temperatures is provided by the formula for tr derived from FIG. 2A. Multiplying the appropriate change in the order of magnitude for tr from a temperature of 250 degrees Celsius to a different temperature on the graph of FIG. 2A will give the retention time (tr) at that different temperature. Thus, the retention time (tr) when a potential of 2.5 Volts is applied across a 30 Å thick gate oxide at 250 degrees Celsius can be extrapolated to provide the retention time when only the temperature is varied. These calculations show a retention time (tr) of $10^{-3}$ hours, or a few seconds, at a temperature of 85 degrees Celsius when a potential of 2.5 Volts is applied across a 30 Å thick gate oxide. These calculations further show a retention time (tr) of 10 hours at a temperature of 27 degrees Celsius, or approximately room temperature.

These calculations show a retention time (tr) comparable to or longer than that of current DRAMs. These estimates are approximate since the data is based on results for much thicker oxides, however, 2.5 V is far in excess of the operating gate voltages of more like less than 1.0 V used on ultrathin gate oxides. The actual retention times are likely to be much longer at these lower operating voltages. Thus, flash memories with 30 Å gate oxides may no longer be non-volatile but their retention times will be long in comparison to DRAMs. Further calculations can be performed in a similar manner to arrives at retention times for ultra thin gate oxides of other thicknesses, e.g. 23 Å.

As disclosed by T. P. Ma et al., *IEEE Electron Device Letters*, vol. 19: no. 10, pp. 388–390 (1998), another technique to estimate the retention time (tr) can be taken from the published curves for current densities which are less than $5 \times 10^{-7}$ A/cm$^2$ for 30 Å gate oxides with voltages across the dielectric of much less than 1.0 Volt. If the charge stored on the floating gate is of the order of $10^{-7}$ Coulombs/cm$^2$, then the retention time is of the order of seconds. There are some inconsistencies in the literature provided here. That is, the tunneling current shown in FIGS. 1A and 1B is F–N or band-to-band tunneling current, the same as disclosed by T. P. Ma et al., *IEEE Electron Device Letters*, vol. 19: no. 10, pp. 388–390 (1998), which is normally assumed to be independent of temperature. Whereas, the tunneling current represented in FIGS. 2A and 2B, as disclosed by C. Papadas et al., *IEEE Trans. on Electron Devices*, vol. 42, pp. 678–681 (April 1995), is thermally assisted tunneling which is a strong function of temperature. However, either technique gives the same estimate for retention times (tr) on the order of seconds at 85 degrees Celsius.

Figure 3:
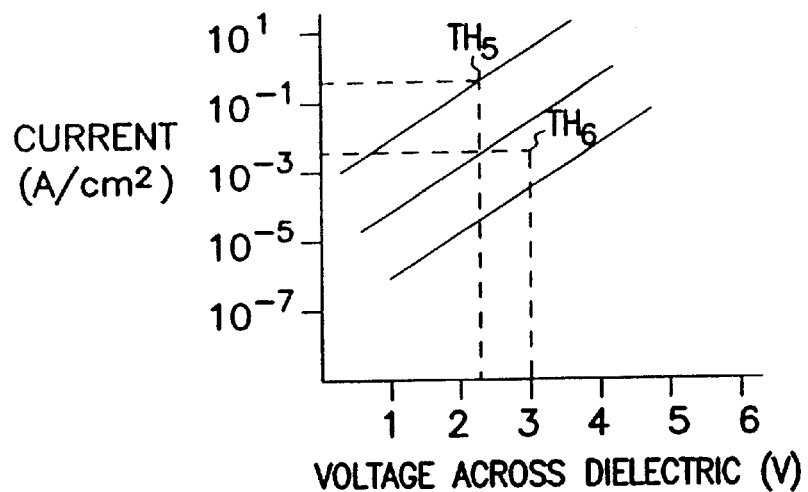
FIG. 3 is a graph that illustrates generally the current density through ultrathin oxides based on an extension of published data from which an erase time can be calculated.

In addition to the long retention time in comparison to DRAMs, the thinner tunneling oxides, according to the teachings of the present invention, will also result in much shorter write and erase times than is customary in conventional flash memories. FIG. 3 is a graph that illustrates generally the current density through ultrathin oxides of various thicknesses, e.g. TH$_5$ and TH$_6$, as a function of the voltage, or potential, applied across the gate oxide, based on an extension of above published data. The graph shown in FIG. 3 can be used to calculate an erase time of the present invention. In one embodiment of the present invention, a n-channel flash memory cell is formed with a 3 nm or 30 Å tunnel gate oxide. Based on the published data in FIG. 3, a 3 nm or 30 Å gate oxide, TH$_6$, with a voltage of –3.0 V across the oxide, and an electric field of 10 megavolts per centimeter (MV/cm) will have a current density of about $5 \times 10^{-3}$ Amperes/cm$^2$. If this current flows for 20 microseconds ($\mu$sec) to write or erase, then the stored charge on the floating gate will change by $10^{-7}$ Coulombs/cm$^2$. In the case of erase with –3.0 V applied to the floating gate and a gate area of $10^{-10}$ cm$^2$, the magnitude of the change of charge on the floating gate will be $10^{-17}$ coulombs or about 100 electrons. This change in charge will result in a change of potential of the floating gate of about 80 milliVolts (mV) since the gate capacitance is about 0.13 femto Farads (fF). Because this device works on a tunnel-tunnel basis, the write time will similarly be 20 microseconds ($\mu$sec) at +3.0 V on the gate.

In another embodiment of the present invention, a n-channel flash memory cell is formed with a 2.3 nm or 23 Å tunnel gate oxide. Based on the above published data, if a 2.3 nm or 23 Å gate oxide, TH$_5$, is used with a voltage of –2.3 V the current density will be orders of magnitude larger, e.g. 0.5 A/cm$^2$, as shown in FIG. 3. In the case of erase with –2.3 V applied to the floating gate and a gate area of $10^{-10}$ cm$^2$, the time necessary to effect a change of charge on the floating gate of $10^{-17}$ Coulombs, or about 100 electrons, will be reduced to 200 nanoseconds (ns). Again, since the device of the present invention works on a tunnel-tunnel basis, the write time will similarly be 200 nanoseconds (ns) at +2.3 V on the gate. This will reduce the write and erase times to 200 nanoseconds (ns).

Figure 4:
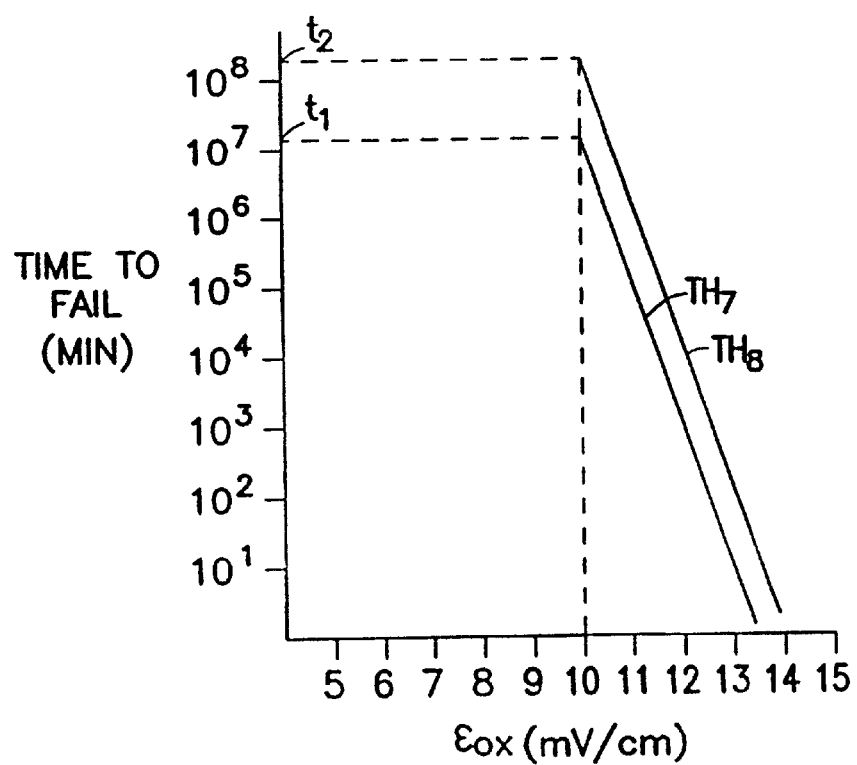
FIG. 4 is a graph that illustrates generally the mean time to failure of the ultra thin tunnel oxides for n-channel flash memory cells according to the teachings of the present invention.

FIG. 4 is a graph that illustrates generally the mean time to failure in minutes vs. the electric field applied across ultra thin tunnel oxides as disclosed by G. Lucovsky et al., *IEEE Electron Device Letters*, vol. 20: no. 6, pp. 262–264 (1999). This recent data suggests that the meantime to failure of ultrathin gate oxides and the total charge to breakdown, QBD, of ultrathin gate oxides may be orders of magnitude larger than tunnel oxides in the 50 Å to 100 Å thickness range. This may result since an electron energy of greater than 1.7 eV and a total potential difference of greater than the order of 4.7 volts is required to cause damage to the oxide as disclosed by G. Lucovsky et al., *IEEE Electron Device Letters*, vol. 20: no. 6, pp. 262–264 (1999); and N. Patel et al., *Appl. Phys. Lett.*, vol. 64: no. 14, 1809–11 (1994). In other words, there is likely a threshold electron energy before significant damaging can occur. From the graph shown in FIG. 4, an electric field of 10 MV/cm across a gate oxide having a thickness of 3 nm (TH$_7$) has a mean time to failure (t$_1$) of approximately $10^7$ minutes, or 20 years. If each operation has a duration of 20 $\mu$sec, the tunnel gate oxide can perform $30 \times 10^{12}$ operations. As shown above, an electric field of 10 MV in a 3 nm tunnel gate oxide in a n-channel flash memory cell of the present invention results in a current density of 5 mA/cm$^2$. A current density of 5 mA/cm$^2$ for a duration of 20 $\mu$sec, repeated for a total of $30 \times 10^{12}$ operations, results in a total charge transferred in one direction through the tunnel gate oxide of $3 \times 10^6$ Coulombs/cm$^2$. Thus, in one embodiment of the present invention, the n-channel flash memory cells having 3.0 V operating voltages and 30 Å (3.0 nm) tunnel oxides will likely have a meantime to failure of 20 years and a total charge to failure, QBD, of $3 \times 10^6$ Coulombs/cm$^2$.

Further, the graph shown in FIG. 4, as disclosed by G. Lucovsky et al., *IEEE Electron Device Letters*, vol. 20: no. 6, pp. 262–264 (1999), illustrates that an electric field of 10 MV/cm across a gate oxide having a thickness of 2.3 nm (TH$_8$) should have an approximate mean time to failure (t$_2$) of approximately 1000 years. For a current density of 5 mA/cm$^2$, this would result in a total charge to failure QBD of $1.5 \times 10^{10}$ Coulombs/cm$^2$. In another embodiment of the present invention, a n-channel flash memory cell having a tunnel gate oxide of 2.3 nm is used. According to the teachings of the present invention, a n-channel flash memory cell having a tunnel gate oxide of 2.3 nm will have a write and erase operation duration of 200 nanoseconds (ns). If the device of the present invention performs a total of $10^{15}$ operations, each with a current density of 0.5 A/cm$^2$ and a duration 200 ns, then the total charge transferred is $10^8$ Coulombs/cm$^2$. This is far less than the total charge to failure, QBD, of $1.5 \times 10^{10}$ Coulombs/cm$^2$, derived from the graph in FIG. 4.

Figure 5A:
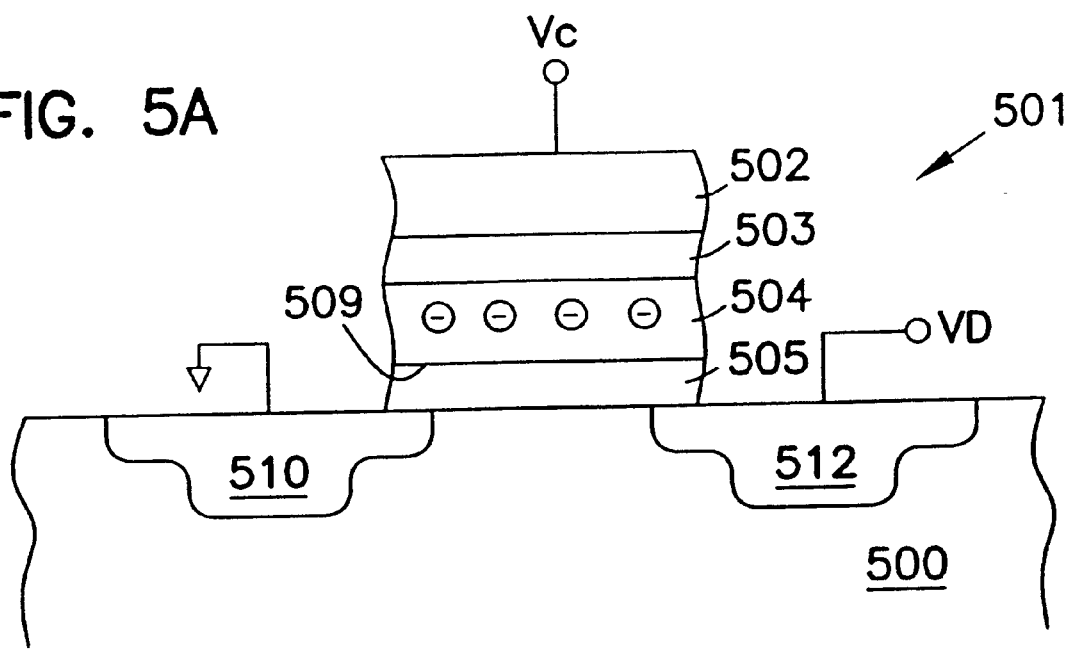
FIGS. 5A–5D illustrate the novel n-channel flash memory cell's operation according to the teachings of the present invention.

FIGS. 5A–5D show an n-channel flash memory cell 501, or n-channel static device 501, having a ultra thin tunnel gate oxide 505 of less than 50 Å as provided earlier in FIG. 1A. As shown in FIGS. 5A–5D, the floating gate 504 has a bottom surface area 509 in contact with the oxide layer, or floating gate oxide 505. In one embodiment according to the teachings of the present invention, the bottom surface area has an area of approximately $10^{-10}$ cm$^2$. FIGS. 5A–5D are provided to illustrate the novel n-channel flash memory cell's operation according to the teachings of the present invention. FIG. 5A illustrates the read operation when the floating gate 504 is charged. That is, according to the teachings of the present invention, when the floating gate 504 has a stored charge of approximately $10^{-17}$ Coulombs, or approximately 100 electrons. In the read operation, a positive potential (Vc) of approximately 1.0 Volts is applied to the control gate 502. The source region 510 is grounded and a positive drain potential (VD) of approximately 1.0 Volts is applied to the drain region 512. As shown in FIG. 5A, the stored charge of approximately $10^{-17}$ Coulombs, or approximately 100 electrons, on the floating gate 504 increases the necessary threshold voltage (VT) of the floating gate 504, required to turn the device "on," by approximately 0.08 Volts. Here, for example, the applied potential of 1.0 Volts to the control gate 502 is insufficient to produce the necessary potential on the floating gate 504. Thus, a channel region for conduction is not established between the drain and source regions, 512 and 510 respectively. In a positive logic scheme the novel n-channel flash memory cell would be read as outputting a "0." Conversely, if the novel n-channel flash memory cell were used in a negative logic scheme the output would be detected as a "1."

Figure 5B:
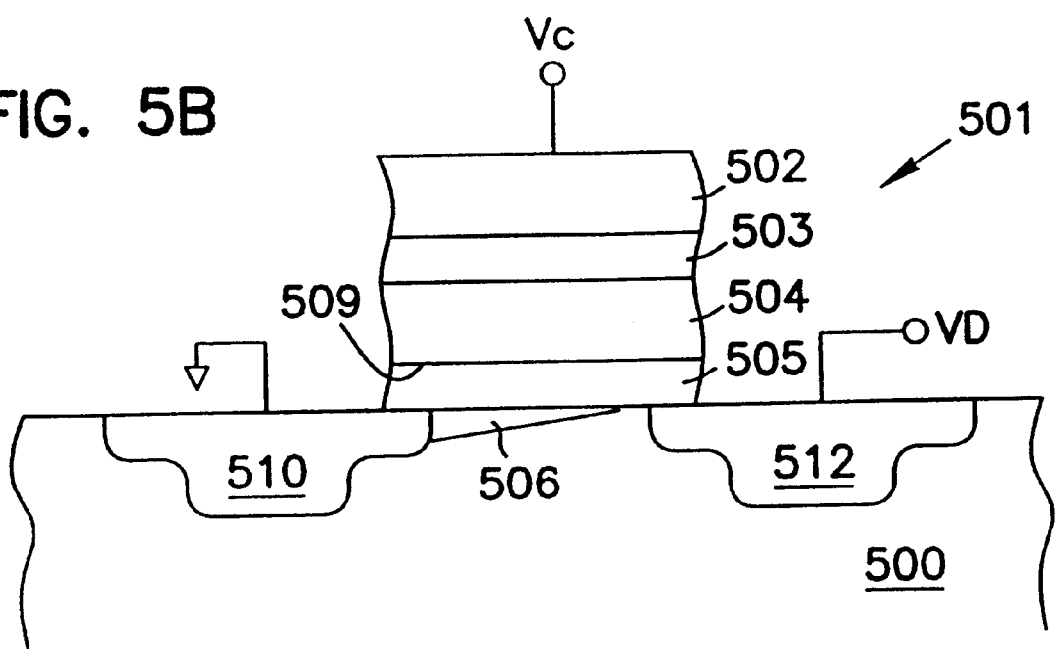

FIG. 5B, illustrates the read operation when the floating gate 504 is not charged. Again, in the read operation, a positive potential (Vc) of approximately 1.0 Volts is applied to the control gate 502. The source region 510 is grounded and a positive drain potential (VD) of approximately 1.0 Volts is applied to the drain region 512. Here, without a stored charge of approximately $10^{-17}$ Coulombs, or approximately 100 electrons, on the floating gate 504, the necessary potential on the floating gate 504, required to turn the device "on," is reduced by 0.08 Volts. Here, for example, the applied potential of 1.0 Volts to the control gate 502 is sufficient to produce the necessary potential on the floating gate 504. Thus, a channel region 506 for conduction is established between the drain and source regions, 512 and 510 respectively. In a positive logic scheme the novel n-channel flash memory cell would be read as outputting a "1." Conversely, if the novel n-channel flash memory cell were used in a negative logic scheme the output would be detected as a "0."

Figure 5C:
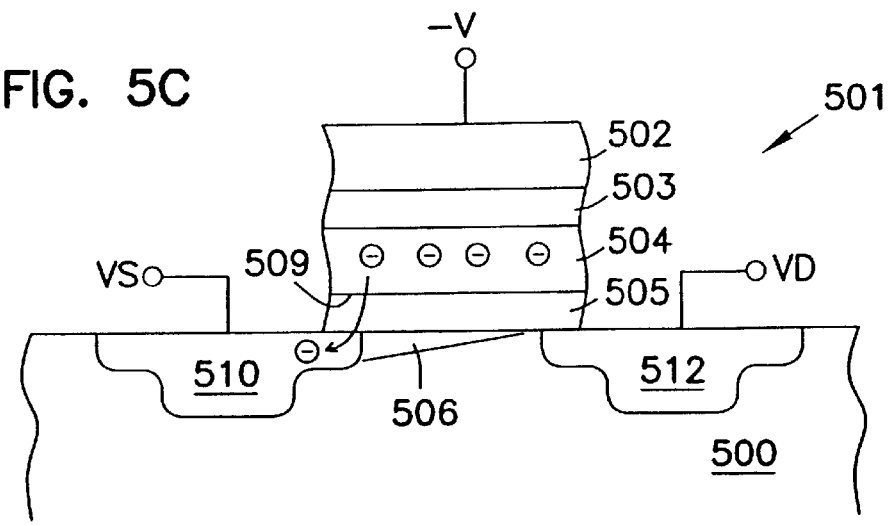

FIG. 5C illustrates the erase operation of the n-channel flash memory cell, or n-channel static device 501, having an n-channel transistor according to the teachings of the present invention. FIG. 5C illustrates the source side tunneling for F–N tunneling erase or thermally assisted tunneling charge leakage of stored electrons off of the floating gate 504. According to the teachings of the present invention, the charge stored on the floating gate is approximately 100 electrons, or approximately $10^{-17}$ Coulombs. In the erase operation of FIG. 5C, a negative voltage potential (−V) is applied to the control gate 502 as necessary to achieve a negative potential across the gate oxide 505.

In one embodiment of the present invention, when the gate oxide has a thickness of 30 Å, a negative voltage potential (−V) is applied to the control gate 502 as necessary to achieve a negative potential across the gate oxide 505 from the floating gate 504 to the source region 510 of approximately −3.0 Volts. As one of ordinarily skill in the art will understand upon reading this disclosure the drain region 512 will be an open circuit so that no potential (VD) is applied at the drain during the erase operation. As one of ordinary skill in the art will understand upon reading this disclosure and according to the parameters for the device shown in FIGS. 5A–5D, a 30 Å thick gate oxide will have an oxide capacitance ($C_0$) of approximately $1.3 \times 10^{-6}$ Farads/cm$^2$. Thus, if the source region 510 is grounded, a negative voltage potential (−V) is applied to the control gate 502 as necessary to achieve a negative potential of −3.0 Volts on the floating gate 504. Alternatively, the source region 510 may be positive (VS) in which case a smaller negative voltage potential (−V) is applied to the control gate 502 as necessary to produce a negative potential on the floating gate to achieve the similar magnitude of a −3.0 Volts across the gate oxide 505. According to the teachings of the present invention, and as described earlier, this magnitude of −3.0 Volts and an electric field of 10 megavolts per centimeter (MV/cm) applied across the gate oxide 505 will have a current density of about $5 \times 10^{-3}$ Amperes/cm$^2$. Since the floating gate 504 of the present invention has a gate area of $10^{-10}$ cm$^2$, the potential is applied across the gate oxide 505 for 20 microseconds ($\mu$sec) to erase the charge of $10^{-17}$ Coulombs or about 100 electrons from the floating gate 504.

Figure 5D:
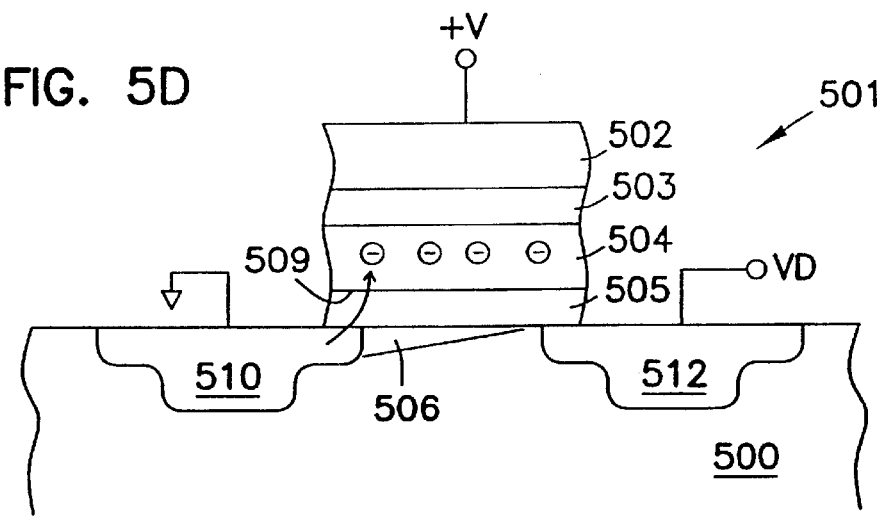

FIG. 5D illustrates the write operation of the n-channel flash memory cell, or n-channel static device 501, having an n-channel transistor according to the teachings of the present invention. In the write operation of FIG. 5C, a positive voltage potential (+V) is applied to the control gate 502 as necessary to achieve a positive potential across the gate oxide 505. In the embodiment of the present invention when the gate oxide has a thickness of 30 Å, a positive voltage potential (+V) is applied to the control gate 502 as necessary to achieve a positive potential across the gate oxide 505 from the floating gate 504 to the source region 510 of approximately +3.0 Volts. As one of ordinarily skill in the art will understand upon reading this disclosure the drain region 512 will be an open circuit so that no potential (VD) is applied at the drain during the erase operation. As one of ordinary skill in the art will understand upon reading this disclosure and according to the parameters for the device shown in FIGS. 5A–5D, a 30 Å thick gate oxide will have an oxide capacitance ($C_0$) of approximately $1.3 \times 10^{-6}$ Farads/cm$^2$. Thus, if the source region 510 is grounded, a positive voltage potential (+V) is applied to the control gate 502 as necessary to achieve a positive potential of +3.0 Volts on the floating gate 504. Alternatively, the source region 510 may be negative in which case a smaller positive voltage potential (+V) is applied to the control gate 502 as necessary to produce a positive potential on the floating gate to achieve the similar magnitude of a +3.0 Volts across the gate oxide 505. According to the teachings of the present invention, and as described earlier, this magnitude of +3.0 Volts and an electric field of 10 megavolts per centimeter (MV/cm) applied across the gate oxide 505 between the floating gate 504 and the source region 510 will produce a current density of about $5 \times 10^{-3}$ Amperes/cm$^2$. Since the floating gate 504 of the present invention has a gate area of $10^{-10}$ cm$^2$, the potential is applied across the gate oxide 505 for 20 microseconds ($\mu$sec) to write a charge of $10^{-17}$ Coulombs, or about 100 electrons, to the floating gate 504.

As disclosed above, another embodiment of the present invention, equally represented in FIGS. 5A–5D includes a novel n-channel flash memory cell which has a gate oxide thickness of 23 Å. According to the teachings of the present invention, the charge stored on the floating gate 504 is approximately 100 electrons, or approximately $10^{-17}$ Coulombs. In this embodiment for the erase operation shown in FIG. 5C, a negative voltage potential (−V) is applied to the control gate 502 as necessary to achieve a negative potential across the gate oxide 505 from the floating gate 504 to the source region 501 of approximately −2.3 Volts. As one of ordinarily skill in the art will understand upon reading this disclosure the drain region 512 will be an open circuit so that no potential (VD) is applied at the drain during the erase operation. Thus, if the source region 510 is grounded, a negative voltage potential (−V) is applied to the control gate 502 as necessary to achieve a negative potential of −2.3 Volts on the floating gate 504. Alternatively, the source region 510 may be positive (VS) in which case a smaller negative voltage potential (−V) is applied to the control gate 502 as necessary to produce a negative potential on the floating gate to achieve the similar magnitude of a −2.3 Volts across the gate oxide 505. According to the teachings of the present invention, and as described earlier, this magnitude of −2.3 Volts and an electric field of 10 megavolts per centimeter (MV/cm) applied across the gate oxide 505 will have a current density orders of magnitude larger than that for a 30 Å gate oxide, i.e. approximately 0.5 A/cm². In this embodiment, since the floating gate 504 of the present invention has a gate area of $10^{-10}$ cm², the −2.3 Volt potential need only be applied across the gate oxide 505 for 200 nanoseconds (nsec) to erase the charge of $10^{-17}$ Coulombs or about 100 electrons from the floating gate 504. Because the n-channel flash memory cell of the present invention works on a tunnel-tunnel basis, the write time will similarly be 200 nanoseconds (nsec) at a +2.3 Volt magnitude potential across the gate oxide 505.

Thus, the dynamic n-channel flash memory cells formed according to the teachings of the present invention, having ultrathin gate oxides, operate with low voltages, e.g. 1.0 Volt or less applied to the control gate for read operations. The new flash cells of the present invention have a longer refresh time than that exists with current DRAM technology, e.g. seconds compared to milliseconds. The new flash cells exhibit a performance equivalent to DRAM cell erase and write times. That is, an erase and write time of approximately 20 μsec to 200 ns depending on the tunnel gate oxide thickness, e.g. 30 Å or 23 Å. The n-channel flash memory cells of the present invention are adapted to have a reliability of a number of cycles of performance of approximately $10^{12}$ to $10^{15}$ cycles over a lifetime of the device depending on the tunnel gate oxide thickness, e.g. 30 Å or 23 Å. The n-channel flash memory cells of the present invention, which can perform a total of $10^{12}$ to $10^{15}$ operations, offer increased endurance over that of a conventional non-volatile flash memory cell. It has also been shown that an n-channel flash memory cell, or n-channel static device having a n-channel transistor formed according to the teachings of the present invention includes a floating gate which is adapted to hold a charge of the order of $10^{-17}$ Coulombs for longer than 10 hours at 20 degrees Celsius. The floating gate on the n-channel flash memory cell of the present invention is also adapted to hold a charge of the order of $10^{-17}$ Coulombs for at least 1.0 second at 85 degrees Celsius.

Figure 6:
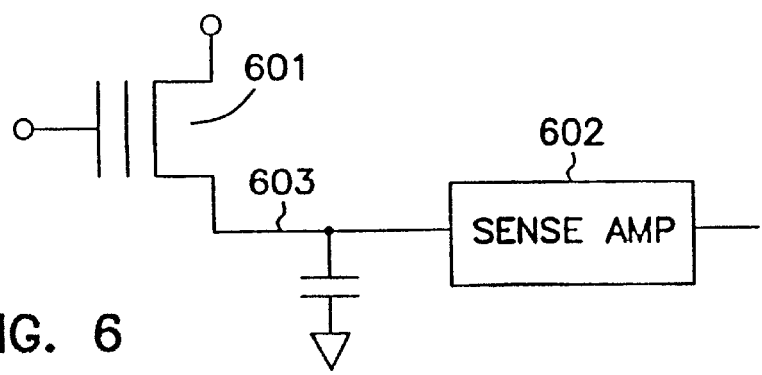
FIG. 6 illustrates an embodiment of a n-channel flash memory cell coupled to a sense amplifier according to the teachings of the present invention.

FIG. 6 illustrates an embodiment of an n-channel flash memory cell 601 coupled to a sense amplifier 602 by a bit line, or digitline 603, according to the teachings of the present invention. FIG. 6 is useful in illustrating the read operation of the n-channel flash memory cells formed according to the teachings of the present invention. According to the teachings of the present invention, the n-channel flash memory cells use an operating voltage of 1.0 Volt or less. That is, a potential of 1.0 Volts or less is applied to the control gate of the n-channel flash memory cell during a read operation. To calculate the effectiveness of the sense, or read operation, a 100 mV change in threshold voltage (ΔVT) for the n-channel flash memory cell is assumed as a consequence of the change in stored charge, e.g. approximately $10^{-17}$ Coulombs, on the floating gate. The charge sensed by the sense amplifier 602 during the read operation can be calculated as follows. The drain to source current is given by:

$$|IDS| = (\epsilon C_0)(W/L)\frac{(VGS - VT)^2}{2}$$

where ∈ is the carrier mobility, $C_0$ is the tunnel gate oxide capacitance, W and L are the width and length of the device respectively, VGS is the potential applied across the floating gate to source region, and VT is the threshold voltage for the device. Since VT approaches VT+ΔVT, the equation can be restated as:

$$|\Delta I| = \left(100\frac{\mu A}{V^2}\right)(1/1)((VGS - VT)\Delta VT)$$

substituting in appropriate values for ∈ and $C_0$, and assuming a device having a 1 to 1 width to length ratio. Taking VGS−VT to be approximately 0.5 Volts and with the change in threshold voltage (ΔVT) to be approximately 0.1 Volts, then the change in current ΔI is as follows:

$$\Delta I = 100\frac{\mu A}{V^2}(1/1)(0.5)(0.1) = 5\mu A.$$

If the read current is sensed for 1.0 nanosecond, $t_{sense}=1$ ns, then the total charge integrated on the bit data sense line 603 will be 5 femto Coulombs (fC).

ΔQ=5×10⁻¹⁵ C

ΔQ=5 fC

Since the transistor is an active device with gain, there is a charge amplification by a factor of 500, the change in charge on the floating gate is 0.01 fC and the change in charge on the bit line 603 is 5 fC. As one of ordinary skill in the art will understand upon reading this disclosure, a charge 5 fC is sufficient for a differential sense amplifier 602 to detect as shown in FIG. 6. Thus, the present invention allows a smaller change in stored charge, e.g. on the order of $10^{-17}$ Coulombs, to be detected in the read or sense operation in a read operation time equivalent to that for DRAM cells, e.g. 1 nanosecond.

Figure 7:
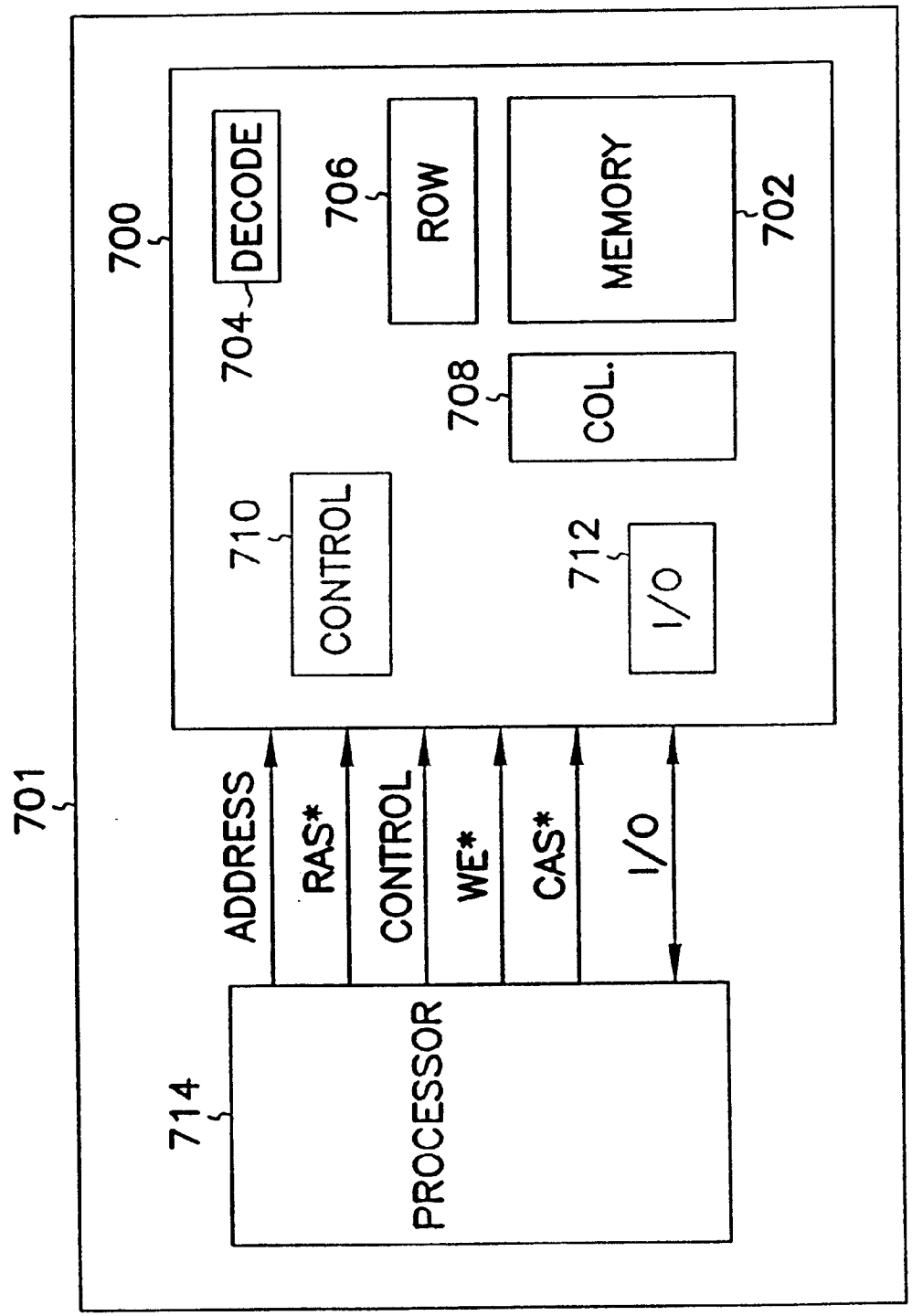
FIG. 7 is a block diagram of a system according to one embodiment of the present invention.

FIG. 7 illustrates a block diagram of an embodiment of a circuit on a single substrate 701, or an electronic system on a chip 701 according to the teachings of the present invention. In the embodiment shown in FIG. 7, the circuit, or system 701 includes a memory device 700 which has an array of memory cells 702, address decoder 704, row access circuitry 706, column access circuitry 708, control circuitry 710, and input/output circuit 712. Also, as shown in FIG. 7, the circuit 701 includes a processor 714, or memory controller for memory accessing. The memory device 700 receives control signals from the processor 714, such as WE*, RAS* and CAS* signals over wiring or metallization lines. The memory device 700 is used to store data which is accessed via 110 lines. It will be appreciated by those skilled in the art that additional circuitry and control signals can be provided, and that the memory device 700 has been simplified to help focus on the invention. At least one of the memory cells 702 has an n-channel transistor, or n-channel flash device, e.g. an n-channel floating gate tunnel oxide (FLOTOX) transistor having an ultrathin gate oxide according to the teachings of the present invention.

It will be understood that the embodiment shown in FIG. 7 illustrates an embodiment for the circuitry of a dynamic n-channel flash memory array with ultra thin tunnel oxides according to the teachings of the present invention. The illustration of a circuit or system 701 as shown in FIG. 7 is intended to provide a general understanding of one application for the structure and circuitry of the present invention, and is not intended to serve as a complete description of all the elements and features of a dynamic n-channel flash memory array with ultra thin tunnel oxides. Further, the invention is equally applicable to any size and type of memory circuit 701 using the dynamic n-channel flash memory cells with ultra thin tunnel oxides of the present invention and is not intended to be limited to the described above. As one of ordinary skill in the art will understand, such single-package processing units as described in FIG. 7 reduce the communication time between the processor and the memory circuit.

As recognized by those skilled in the art, circuits of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Other circuits containing the dynamic n-channel flash memory cells with ultra thin tunnel oxides described in this disclosure include circuitry for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 8:
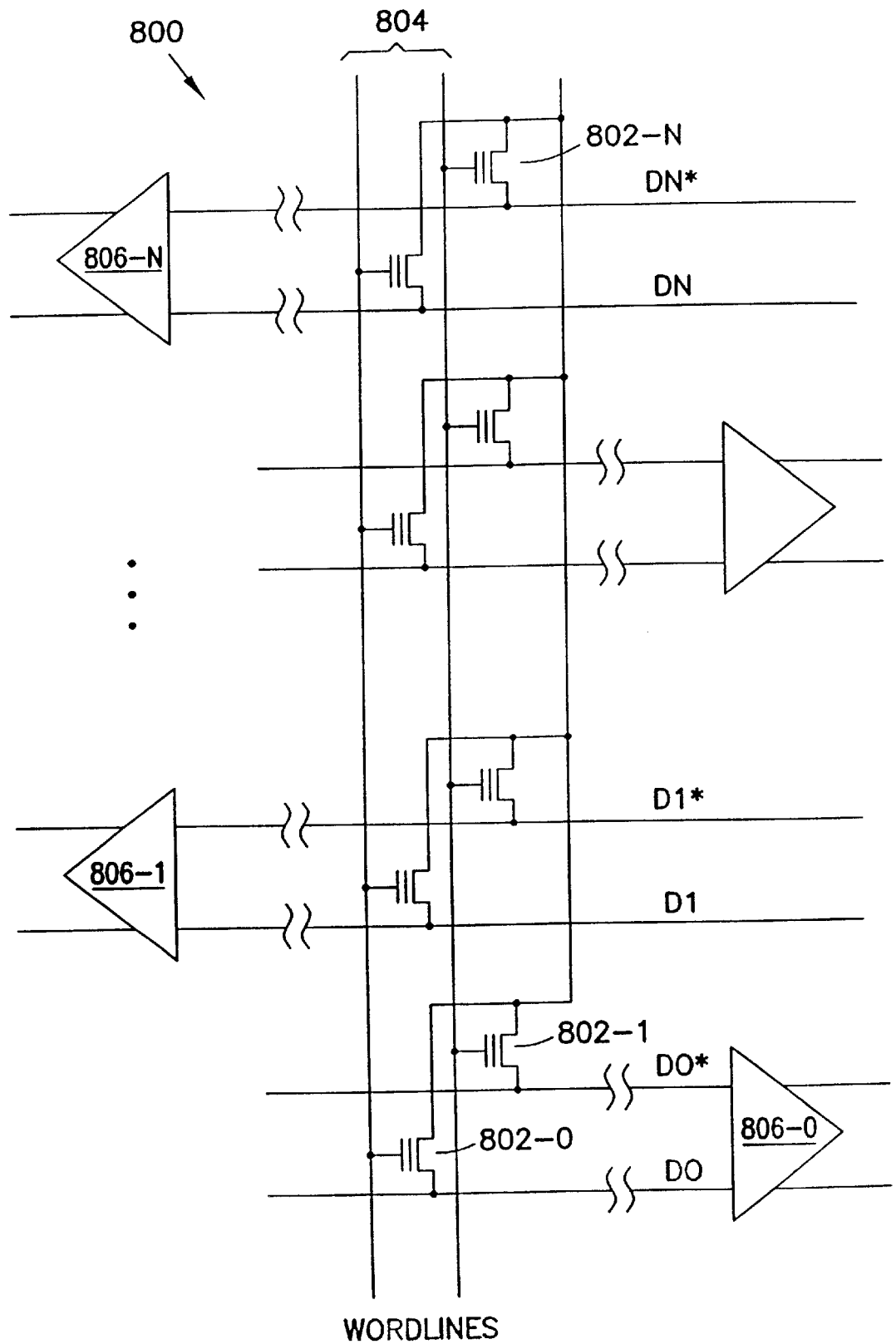
FIG. 8 illustrates an embodiment of a memory array according to the teachings of the present invention, as can be included in a memory device.

FIG. 8 illustrates an embodiment of a memory array 800, according to the teachings of the present invention, as can be included in a memory device, e.g. on a memory chip/die. The memory array shown in FIG. 8 includes a plurality of memory cells, 802-0, 802-1, ... , 802-N. The plurality of memory cells, 802-0, 802-1, ... , 802-N, includes at least one n-channel flash memory cell formed according to the teachings of the present invention. That is, the at least one n-channel flash memory cell includes a source region and a drain region with a channel therebetween. A floating gate is separated from the channel region by an oxide layer, or tunnel gate oxide having a thickness of less than 50 Å. As shown in FIG. 8, the plurality of memory cells are coupled to a plurality, or number of sense amplifiers 806-0, 806-1, . . . , 806-N via a number of bit lines, or digitlines, D0*, D0, D1*, D1, ... , DN*. FIG. 8 is illustrative of the manner in which the dynamic n-channel flash memory cells of the present invention can be used in a folded bit line configuration, in substitution for a conventional folded bit line DRAM array. One of ordinary skill in the art will understand upon reading this disclosure, that the n-channel flash memory cells of the present invention can further be used in an open bit line configuration or any other digitline twist scheme. The invention is not so limited. One of ordinary skill in the art will further understand upon reading this disclosure that n-channel flash memory cells of the present invention allow a smaller change in stored charge on the floating gate to be detected.

The Figures represented and described in detail above are similarly useful in describing the methods of the present invention. That is one embodiment of the present invention includes forming an n-channel memory cell. Forming the n-channel memory cell includes forming an oxide layer of less than 50 Angstroms (Å) on a substrate having a channel region separating a source and a drain region in the substrate. A floating gate is formed on the oxide layer. A dielectric layer is formed on the floating gate. And, a control gate is formed on the dielectric layer. In one embodiment, forming the oxide layer includes forming the oxide layer to have a thickness of 23 Angstroms (Å). According to the teachings of the present invention, forming a floating gate includes forming a floating gate which is adapted to hold a charge on the order of $10^{-17}$ Coulombs for longer than 10 hours at 20 degrees Celsius. Also, forming a floating gate includes forming a floating gate which is adapted to hold a charge of the order of $10^{-17}$ Coulombs for at least 1.0 second at 85 degrees Celsius. According to the teachings of the present invention, forming the floating gate includes forming a floating gate which has a bottom surface area in contact with the oxide layer of approximately $10^{-10}$ cm². Forming the n-channel memory cell includes forming the n-channel memory cell to operate at a voltage of approximately 1.0 Volts applied to the control gate.

Another embodiment of the present invention includes a method for forming an n-channel transistor. The method for forming the n-channel transistor includes forming an oxide layer of less than 50 Angstroms (Å) on a substrate having a channel region separating a source and a drain region in the substrate. A floating gate is formed on the oxide layer. Forming the floating gate includes forming a floating gate which is adapted to hold a charge on the order of $10^{-17}$ Coulombs for longer than 1.0 hour at 20 degrees Celsius. In one embodiment, forming the oxide layer includes forming the oxide layer to have a thickness of 23 Angstroms (Å). Also, forming a floating gate includes forming a floating gate which is adapted to hold a charge of the order of $10^{-17}$ Coulombs for at least 1.0 second at 85 degrees Celsius. According to the teachings of the present invention, forming the floating gate includes forming a floating gate which has a bottom surface area in contact with the oxide layer of approximately $10^{-10}$ cm². Forming the n-channel transistor includes forming the n-channel transistor cell to operate at a voltage of approximately 1.0 Volts applied to the control gate.

In one embodiment, forming the n-channel transistor further includes forming an intergate dielectric on the floating gate and forming a control gate on the intergate dielectric. Further, forming the n-channel transistor includes forming the n-channel transistor to have an operating voltage of less than 2.5 Volts across the oxide layer.

A method of forming a memory device is similarly included within the scope of the present invention. According to the teachings of the present invention, forming a memory device includes forming a plurality of memory cells such that forming the plurality of memory cells includes forming at least one n-channel memory cell. Forming the at least one n-channel memory cell includes forming an oxide layer of less than 50 Angstroms (Å) on a substrate having a channel region separating a source and a drain region in the substrate. A floating gate is formed on the oxide layer such that the floating gate is adapted to hold a charge on the order of $10^{-17}$ Coulombs for longer than 1.0 hour at 20 degrees Celsius. At least one sense amplifier is formed. Forming at least one sense amplifier includes coupling the at least one amplifier to the plurality of memory cells. In one embodiment, forming an oxide layer of less than 50 Angstroms (Å) includes forming the oxide layer to have a thickness of 23 Angstroms (Å). Forming the floating gate further includes forming a floating gate which is adapted to hold a charge on the order of $10^{-17}$ Coulombs for at least 1.0 second at 85 degrees Celsius.

Forming the memory device according to the teachings of the present invention further includes forming the at least one n-channel memory cell to have an operating voltage of approximately 1.0 Volt as applied to the control gate in order to perform a read operation on the memory device. Also, forming the memory device according to the teachings of the present invention further includes forming the at least one n-channel memory cell to have an operating voltage of less than 2.5 Volts as applied across the oxide layer in order to perform a write and/or erase operation on the memory device.

Another embodiment of the present invention includes a method for operating a n-channel memory cell. The method includes applying a potential of less than 3.0 Volts across a floating gate oxide, or tunnel gate oxide layer which is less than 50 Angstroms, in order to add or remove a charge from a floating gate. The floating gate is adapted to hold a charge of the order of $10^{-17}$ Coulombs for longer than 10 hours at 20 degrees Celsius and is also adapted to hold a charge of the order of $10^{-17}$ Coulombs for at least 1.0 second at 85 degrees Celsius. The method also includes reading the n-channel memory cell by applying a potential to a control gate of the n-channel memory cell of less than 1.0 Volt. In one embodiment of this method, applying a potential of less than 3.0 Volts across a floating gate oxide in order to add or remove a charge from a floating gate includes applying the potential for less than 20 microseconds. The method of the present invention further includes refreshing the n-channel memory cell to renew a charge on the floating gate at 1.0 second intervals. In one embodiment, refreshing the n-channel memory cell to renew a charge on the floating gate at 1.0 second intervals includes renewing a charge of approximately 100 electrons on the floating gate.

In another embodiment of the method for operating a n-channel memory cell, the method includes refreshing a charge on a floating gate of the n-channel memory cell by applying an electric field of approximately 10 mega Volts/centimeter (MV/cm) across a floating gate oxide. The floating gate is adapted to hold a charge of the order of $10^{-17}$ Coulombs for longer than 10 hours at 20 degrees Celsius and is also adapted to hold a charge of the order of $10^{-17}$ Coulombs for at least 1.0 second at 85 degrees Celsius. According to the teachings of the present invention the floating gate oxide is less than 30 Angstroms. In this embodiment, the method further includes reading the n-channel memory cell by applying a potential to a control gate of the n-channel memory cell of less than 1.0 Volt. According to this embodiment, refreshing a charge on a floating gate for the n-channel memory cell by applying an electric field of approximately 10 mega Volts/centimeter (MV/cm) across a floating gate oxide of less than 30 Angstroms includes restoring a charge of approximately $10^{-17}$ Coulombs to the floating gate. Also, according to this embodiment, refreshing a charge on a floating gate for the n-channel memory cell by applying an electric field of approximately 10 mega Volts/centimeter (MV/cm) across a floating gate oxide of less than 30 Angstroms includes applying the electric field for less than 20 microseconds. Further, the method includes refreshing the n-channel memory cell to renew a charge on the floating gate at 1.0 second intervals.

Another embodiment of the present invention includes a method for operating an n-channel memory cell. Here, the method includes applying a potential of approximately 2.3 Volts across a floating gate oxide in order to add or remove a charge from a floating gate. In this embodiment, applying a potential of approximately 2.3 Volts across a floating gate oxide includes applying a potential of approximately 2.3 Volts across a floating gate oxide which has a thickness of approximately 23 Angstroms. The floating gate is adapted to hold a charge of the order of $10^{-17}$ Coulombs for longer than 10 hours at 20 degrees Celsius and is also adapted to hold a charge of the order of $10^{-17}$ Coulombs for at least 1.0 second at 85 degrees Celsius. The method further includes reading the n-channel memory cell by applying a potential to a control gate of the n-channel memory cell of less than 1.0 Volt. In this embodiment, applying a potential of approximately 2.3 Volts across a floating gate oxide includes applying the potential for less than 200 nanoseconds. In this embodiment, the method further includes refreshing the n-channel memory cell to renew a charge on the floating gate at 1.0 second intervals. Further, in this embodiment, refreshing the n-channel memory cell to renew a charge on the floating gate at 1.0 second intervals includes renewing a charge of approximately 100 electrons on the floating gate.

Conclusion

Thus, structures and methods for dynamic n-channel flash memory cells with ultra thin tunnel oxides have been shown. Both the write and erase operations are performed by tunneling. Since the tunneling current is not only a function of the applied electric fields but is also an exponential function of the tunnel oxide thickness, thinner gate tunnel oxides will reduce the time for write and erase operations by orders of magnitude. Thinner tunnel oxides will also result in reduced retention times since the thinner oxides will result in increased thermally assisted tunneling of electrons off the floating polysilicon charge storage gate. According to the teachings of the present invention, an n-channel flash memory with thin tunnel oxides will operate on a dynamic basis, the stored data can be refreshed every few seconds as necessary; the write and erase operations will however now be orders of magnitude faster. In this respect then, the n-channel flash memory now operates in a manner equivalent to DRAMs, except there is no longer a requirement for large stacked storage capacitors or deep trench storage capacitors. The large capacitors are unnecessary since the cell now is active in nature and the transistor provides a large gain. The present invention further provides structures and methods for n-channel floating gate transistors which avoid n-channel threshold voltage shifts and achieve source side tunneling erase.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. An n-channel memory cell, comprising:
   a substrate;
   a drain region formed in the substrate;
   a source region in the substrate;
   a channel region in the substrate separating the drain region from the source region;
   a floating gate separated from the channel region by less than 50 Angstroms (Å), wherein the floating gate is adapted to hold an electrical charge;

a dielectric layer on the floating gate; and a control gate on the dielectric layer.

2. The memory cell of claim 1, wherein the floating gate is separated from the channel region by approximately 30 Angstroms (Å).

3. The memory cell of claim 1, wherein the floating gate is adapted to hold a charge of the order of $10^{-17}$ Coulombs at for longer than 10 hours at 20 degrees Celsius.

4. The memory cell of claim 1, wherein the floating gate is adapted to hold a charge of the order of $10^{-17}$ Coulombs at for at least 1.0 second at 85 degrees Celsius.

5. The memory cell of claim 1, wherein the floating gate has a bottom surface area of approximately $10^{-10}$ cm$^2$.

6. The memory cell of claim 5, wherein the bottom surface area is greater than the area of the channel region.

7. The memory cell of claim 1, wherein the memory cell has an operating voltage of approximately 1.0 Volts.

8. The memory cell of claim 1, wherein the n-channel memory cell is adapted to have a reliability of a number of cycles of performance of approximately $10^{15}$ cycles over a lifetime of the n-channel memory cell.

9. An n-channel memory cell, comprising:

a control gate;

a floating gate separated from the control gate by a dielectric layer;

an oxide layer of less than 50 Angstroms (Å), wherein the oxide layer separates the floating gate from a channel region; and wherein the oxide layer has a mean time to failure of approximately $10^7$ minutes.

10. The memory cell of claim 9, wherein the oxide layer is approximately 30 Angstroms (Å).

11. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes; and wherein the floating gate is adapted to hold a charge of the order of $10^{-17}$ Coulombs for longer than 10 hours at 20 degrees Celsius.

12. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes; and wherein the floating gate is adapted to hold a charge of the order of $10^{-17}$ Coulombs at for at least 1.0 second at 85 degrees Celsius.

13. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean to failure of approximately $10^7$ minutes; and wherein the floating gate has a bottom surface area in contact with the oxide layer of approximately $10^{-10}$ cm$^2$.

14. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes; and wherein the memory cell has an operating voltage of approximately 1.0 Volts.

15. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes; and wherein the n-channel memory cell is adapted to have a reliability of a number of cycles of performance of approximately $10^{15}$ cycles over a lifetime of the n-channel memory cell.

16. The memory cell of claim 9, wherein the oxide layer is a single oxide layer and only the single oxide layer separates the floating gate from the channel region.

17. The memory cell of claim 9, wherein the channel region separates a source and a drain region in a substrate.

18. A dynamic n-channel flash memory cell, comprising:

a substrate;

a drain region formed in the substrate;

a source region in the substrate;

a channel region in the substrate separating the drain region from the source region;

a floating gate separated from the channel region by less than 50 Angstroms (Å), wherein the floating gate is adapted to hold an electrical charge with some amount of leakage due to the floating gate being separated from the channel region by less than 50 Angstroms (Å);

a dielectric layer on the floating gate; and a control gate on the dielectric layer.

19. The memory cell of claim 18, wherein the floating gate is separated from the channel region by approximately 30 Angstroms (Å).

20. The memory cell of claim 18, wherein the floating gate is adapted to hold a charge of the order of $10^{-17}$ Coulombs at for longer than 10 hours at 20 degrees Celsius.

21. The memory cell of claim 18, wherein the floating gate is adapted to hold a charge of the order of $10^{-17}$ Coulombs at for at least 1.0 second at 85 degrees Celsius.

22. The memory cell of claim 18, wherein the floating gate has a bottom surface area of approximately $10^{-10}$ cm$^2$.

23. The memory cell of claim 22, wherein the bottom surface area is greater than the area of the channel region.

24. The memory cell of claim 18, wherein the memory cell has an operating voltage of approximately 1.0 Volts.

25. The memory cell of claim 18, wherein the n-channel memory cell is adapted to have a reliability of a number of cycles of performance of approximately $10^{15}$ cycles over a lifetime of the n-channel memory cell.

26. A dynamic n-channel flash memory cell, comprising:
   a substrate;
   a drain region formed in the substrate;
   a source region in the substrate;
   a channel region in the substrate separating the drain region from the source region;
   a tunnel layer on the channel region having a thickness of less than 50 Angstroms (Å);
   a floating gate separated from the channel region by the tunnel layer, wherein the floating gate is adapted to hold an electrical charge with some amount of leakage due to the floating gate being separated from the channel region by less then 50 Angstroms (Å);
   a dielectric layer on the floating gate; and
   a control gate on the dielectric layer.

27. The memory cell of claim 26, wherein the tunnel layer allows leakage from the floating gate to the source region due to thermally assisted tunneling charge leakage of stored electrons from the floating gate.

28. The memory cell of claim 26, wherein the tunnel layer allows electrons to move from the source region to the floating gate during a write operation.

29. A dynamic n-channel flash memory cell, comprising:
   a substrate;
   a drain region formed in the substrate;
   a source region in the substrate;
   a channel region in the substrate separating the drain region from the source region;
   a tunnel layer on the channel region having a thickness of less than 50 Angstroms (Å);
   a floating gate separated from the channel region by the tunnel layer, wherein the floating gate is adapted to hold an electrical charge with some amount of leakage due to the floating gate being separated from the channel region by less than 50 Angstroms (Å);
   a dielectric layer on the floating gate;
   a control gate on the dielectric layer;
   wherein the tunnel layer allows electrons to move from the source region to the floating gate during a write operation; and
   wherein, during the write operation, the control gate is held at a positive potential, the source region is grounded and the drain region is open.

30. The memory cell of claim 28, wherein the tunnel layer has a thickness of less than approximately 30 Angstroms (Å).

31. The memory cell of claim 26, wherein a tunnel layer has a thickness of less than approximately 30 Angstroms (Å).

32. A tri-operation, dynamic n-channel flash memory cell, comprising:
   a substrate;
   a drain region formed in the substrate;
   a source region in the substrate;
   a channel region in the substrate separating the drain region from the source region;
   a tunnel layer on the channel region having a thickness of less than 50 Angstroms (Å);
   a floating gate separated from the channel region by the tunnel layer, wherein the floating gate is adapted to hold an electrical charge with some amount of leakage due to the floating gate being separated from the channel region by less then 50 Angstroms (Å);
   a dielectric layer on the floating gate;
   a control gate on the dielectric layer;
   wherein a first operation of the memory cell includes the control gate held at a positive potential, the drain region held at a positive potential, and the source region held at ground;
   wherein a second operation of the memory cell includes the control gate held at a negative potential, the drain region held at a positive potential and the source regon held at a positive potential; and
   wherein a third operation of the memory cell includes the control gate at a positive potential, the drain region at a positive potential and the source region at ground.

33. A tri-operation, dynamic n-channel flash memory cell, comprising:
   a substrate;
   a drain region formed in the substrate;
   a source region in the substrate;
   a channel region in the substrate separating the drain region from the source region;
   a tunnel layer on the channel region having a thickness of less than 50 Angstroms (Å);
   a floating gate separated from the channel region by the tunnel layer, wherein the floating gate is adapted to hold an electrical charge with some amount of leakage due to the floating gate being separated from the channel region by less than 50 Angstroms (Å);
   a dielectric layer on the floating gate;
   a control gate on the dielectric layer;
   wherein a first operation of the memory cell includes the control gate held at a positive potential, the drain region at a positive potential, and the source region held at ground;
   wherein a second operation of the memory cell includes the control gate held at a negative potential, the drain region held at a positive potential and the source region held at a positive potential;
   wherein a third operation of the memory cell includes the control gate at a positive potential, the drain region at a positive potential and the source region at ground; and
   wherein the first operation is a read operation, and wherein the control gate and the drain region are both held at approximately one volt.

34. The memory cell of claim 33, wherein the floating gate stores a charge of approximately $10^{-17}$ Coulombs which increases a threshold voltage above one volt thereby preventing the channel region form conducting between the source and drain regions.

35. The memory cell of claim 33, wherein the floating gate stores is essentially free of charge such that a threshold voltage of is met to cause the channel region to conduct between the source and drain regions.

36. A method of operating a memory array that includes a plurality of dynamic n-channel memory cells, comprising:
   applying a potential of less than 3.0 Volts across a select plurality of single floating gate oxides, wherein each of the single floating gate oxides are less than 50 Angstroms, in order to add or remove a charge from a floating gate, and wherein the single floating gate oxide separates the floating gate from a channel region; and
   reading the n-channel memory cell by applying a potential to control gates of a select plurality of n-channel memory cells of less than 1.0 Volt.

37. The method of claim 36, wherein applying a potential of less than 3.0 Volts across a select plurality of floating gate oxides in order to add or remove a charge from a floating gate includes applying the potential for less than 20 microseconds.

38. The method of claim 36, wherein the method further includes refreshing the n-channel memory cells to renew a charge on the floating gate at 1.0 second intervals.

39. The method of claim 38, wherein refreshing the n-channel memory cell to renew a charge on the floating gate at 1.0 second intervals includes renewing a charge of approximately 100 electrons on the floating gate.

40. A method of operating a memory array that includes a plurality of dynamic n-channel memory cells, comprising:

applying a potential of less than 3.0 Volts across a select plurality of single floating gate oxides, wherein each of the single floating gate oxides are less than 50 Angstroms, in order to add or remove a charge from a floating gate, and wherein only the single floating gate oxide separates the floating gate from a channel region; and reading the n-channel memory cell by applying a potential to control gates of a select plurality of n-channel memory cells of less than 1.0 Volt.

41. The method of claim 40, wherein applying a potential of less than 3.0 Volts across a select plurality of floating gate oxides in order to add or remove a charge from a floating gate includes applying the potential for less than 20 microseconds.

42. The method of claim 40, wherein the method further includes refreshing the n-channel memory cells to renew a charge on the floating gate at 1.0 second intervals.

43. The method of claim 42, wherein refreshing the n-channel memory cell to renew a charge on the floating gate 1.0 second intervals includes renewing a charge of approximately 100 electrons on the floating gate.

44. A method of operating a memory array that includes a plurality of dynamic n-channel memory cells, comprising:

applying a potential on a pair of complementary wordlines connected to a select plurality of dynamic n-channel memory cells;

applying a potential on drains of the select plurality of dynamic n-channel memory cells;

wherein applying the potential on the pair of complementary wordlines and drains produces a potential of less than 3.0 Volts across single floating gate oxides of the select plurality of dynamic n-channel memory cells, wherein each of the single floating gate oxides are less than 50 Angstroms, in order to add or remove a charge from a floating gate; and reading the dynamic n-channel memory cells by applying a potential to control gates of a select plurality of n-channel memory cells of less than 1.0 Volt.

45. The method of claim 44, wherein only the single floating gate oxide separates the floating gate from a channel region.

46. The method of claim 44, wherein reading the dynamic n-channel memory cells includes sensing the charge using sense amplifiers.

47. The method of claim 46, wherein reading the dynamic n-channel memory cells includes reading the charge stored in the floating gates through bit lines.

48. The method of claim 46, wherein applying potential in order to add or remove a charge from a floating gate includes adding or removing charge in a complimentary manner to pairs of dynamic n-channel memory cells.

49. The method of claim 48, wherein reading the dynamic n-channel memory cells includes connecting pairs of digit lines to respective pairs of dynamic n-channel memory cells and sensing the potential on the pairs of digit lines using sense amplifiers.

50. An n-channel memory cell, comprising:

a control gate;

a floating gate separated from the control gate by a dielectric layer;

an oxide layer of less than 50 Angstroms (Å), wherein the oxide layer separates the floating gate from a channel region; and wherein the floating gate is adapted to hold a charge of the order of $10^{-17}$ Coulombs for longer than 10 hours at 20 degrees Celsius.

51. The memory cell of claim 50, wherein the oxide layer is approximately 30 Angstroms (Å).

52. The memory cell of claim 50, wherein the floating gate has a bottom surface area in contact with the oxide layer of approximately $10^{-10}$ cm$^2$.

53. The memory cell of claim 50, wherein the memory cell has an operating voltage of approximately 1.0 Volts.

54. The memory cell of claim 50, wherein the n-channel memory cell is adapted to have a reliability of a number of cycles of performance of approximately $10^{-15}$ cycles over a lifetime of the n-channel memory cell.

55. The memory cell of claim 50, wherein the oxide layer is a single oxide layer and only the single oxide layer separates the floating gate from the channel region.

56. The memory cell of cliam 50, wherein the channel region separates a source and a drain region in a substrate.

57. An n-channel memory cell, comprising:

a control gate;

a floating gate separated from the control gate by a dielectric layer;

an oxide layer of less than 50 Angstroms (Å), wherein the oxide layer separates the floating gate from a channel region; and wherein the floating gate is adapted to hold a charge of the order of $10^{-17}$ Coulombs at for at least 1.0 second at 85 degrees Celsius.

58. The memory cell of claim 57, wherein the oxide layer is approximately 30 Angstroms (Å).

59. The memory cell of claim 57, wherein the floating gate has a bottom surface area in contact with the oxide layer of approximately $10^{-10}$ cm$^2$.

60. The memory cell of claim 57, wherein the memory cell has an operating voltage of approximately 1.0 Volts.

61. The memory cell of claim 57, wherein the n-channel memory cell is adapted to have a reliability of a number of cycles of performance of approximately $10^{15}$ cycles over a lifetime of the n-channel memory cell.

62. The memory cell of claim 57, wherein the oxide layer is a single oxide laye and only the single oxide layer separates the floating gate from the channel region.

63. The memory cell of claim 57, wherein the channel region separates a source and a drain region in a substrate.

64. A method of operating a memory array that includes a plurality of dynamic n-channel memory cells, comprising:

applying a potential on a pair of complementary wordlines connected to a select plurality of dynamic n-channel memory cells;

applying a potential on drains of the select plurality of dynamic n-channel memory cells;

wherein applying the potential on the pair of complementary wordlines and drains produces a potential of less than 3.0 Volts across a region of less than 50 Angstroms to add or remove a charge from a floating gate; and reading the dynamic n-channel memory cells by applying a potential to control gates of a select plurality of n-channel memory cells of less than 1.0 Volt.

65. The method of claim 64, wherein only the single floating gate oxide separates the floating gate from a channel region.

66. The method of claim 64, wherein reading the dynamic n-channel memory cells includes sensing the charge using sense amplifiers.

67. The method of claim 64, wherein reading the dynamic n-channel memory cells includes reading the charge stored in the floating gates through bit lines.

68. The method of claim 64, wherein applying potential in order to add or remove a charge from a floating gate includes adding or removing charge in a complimentary manner to pairs of dynamic n-channel memory cells.

69. The method of claim 68, wherein reading the dynamic n-channel memory cells includes connecting pairs of digit lines to respective pairs of dynamic n-channel memory cells and sensing the potential on the pairs of digit lines using sense amplifiers.

70. A method of operating a dynamic flash memory cell that includes a channel region separating a source region and a drain region, comprising:

applying an electrical charge of less than three volts across a region of less than 50 Angstroms separting the channel region from a floating gate so that charge is added to or removed from the floating gate; and reading the charge of the floating gate to determine a state of the memory cell.

71. The method of claim 70, wherein applying the electrical charge includes applying the charge across the region that has a thickness of approximately 30 Angstroms.

72. The method of claim 70, wherein applying the charge includes holding the charge on the order of $10^{-17}$ Coulombs in the floating gate for longer than 10 hours at 20 degrees Celsius.

73. The method of claim 70, wherein applying the charge includes holding the charge on the order of $10^{-17}$ Coulombs in the floating gate for at least 1.0 second at 85 degrees Celsius.

74. The method of claim 70, wherein applying the charge includes applying the charge to a floating gate bottom surface area of approximately $10^{-10}$ cm$^2$.

75. The method of claim 70, wherein applying the charge includes applying the charge to a floating gate bottom surface area that is greater than an area of the channel region.

76. The method of claim 70, wherein reading the charge on the floating gate includes applying an operating voltage of approximately 1.0 Volts.

77. The method of claim 70, wherein applying the charge includes providing a reliability of a number of cycles of performance of approximately $10^{15}$ cycles over a lifetime of the dynamic flash memory cell.

78. The method of claim 70, wherein applying the charge includes periodically refreshing the charge.

79. A method for reading a charge in a dynamic flash memory cell, comprising storing a charge in a floating gate; and reading the charge in the floating at a distance of less than 50 Angstroms.

80. The method of claim 79, wherein storing the charge includes storing a charge of approximately zero Coulombs for a first memory state and approximately $10^{-17}$ Coulombs for a second memory state.

81. The method of claim 79, wherein storing the charge includes applying a write voltage of approximately 3.0 Volts across the floating gate and a tunnel oxide distance of less than 50 Angstroms.

82. The method of claim 79, wherein reading the charge includes applying a control voltage of about 1.0 Volt or less to the memory cell.

83. The method of claim 79, wherein storing charge includes holding the charge in the floating gate for longer than 10 hours at 20 degree Celsius.

84. The method of claim 83, wherein storing the charge includes holding the charge for less time than non-volatile flash memory cell.

85. The method of claim 79, wherein storing the charge includes holding the charge in the floating gate for at least 1.0 second at 85 degrees Celsius.

86. The method of claim 79, wherein storing the charge includes periodically refreshing the charge.

87. The memory cell of claim 1, wherein the floating gate is separated from the channel region by approximately 23 Angstroms (Å).

88. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes; and wherein the oxide layer is approximately 23 Angstroms (Å).

89. An n-channel memory cell, comprising:

a control gate;

a floating gate separated from the control gate by a dielectric layer;

an oxide layer of less than 50 Angstroms (Å), wherein the oxide layer separates the floating gate from a channel region;

wherein the oxide layer has a mean time to failure of approximately $10^7$ minutes;

wherein the oxide layer is a single oxide layer and only the single oxide layer separates the floating gate from the channel region; and wherein the floating gate is separated from the channel region by approximately 23 Angstroms (Å).

90. A dynamic n-channel flash memory cell, comprising:

a substrate;

a drain region formed in the substrate;

a source region in the substrate;

a channel region in the substrate separating the drain region from the source region;

a tunner layer on the channel region having a thickness of less than 50 Angstroms (Å);

a floating gate separated from the channel region by the tunnel layer, wherein the floating gate is adapted to hold an electrical charge with some amount of leakage due to the floating gate being separated from the channel region by less than 50 Angstroms (Å);

a dielectric layer on the floating gate;

a control gate on the dielectric layer; and wherein the tunnel layer allows electrons to move form the source region to the floating gate during a write operation; and wherein the tunnel layer has a thickness of approximately 23 Angstroms (Å).

91. The memory cell of claim 50, wherein the oxide layer is approximately 23 Angstroms (Å).

92. The memory cell of claim 57, wherein the oxide layer is approximately 23 Angstroms (Å).

93. A method of operating a dynamic flash memory cell that includes a channel region separating a source region and a drain region, comprising:

applying an electrical charge of less than three volts across a region of less than 50 Angstroms separating the channel region form a floating gate so that charge is added to or removed from the floating gate;

reading the charge of the floating gate to determine a state of the memory cell;

wherein applying the electrical charge includes applying the charge across the region that has a thickness of approximately 23 Angstroms.

* * * * *

UNITED STATES PATENT AND TRADEMARK OFFICE
CERTIFICATE OF CORRECTION

PATENT NO. : 6,456,535 B2
DATED : September 24, 2002
INVENTOR(S) : Leonard Forbes et al.

It is certified that error appears in the above-identified patent and that said Letters Patent is hereby corrected as shown below:

Column 6,
Line 18, delete "tr $e^{(\Delta E/kT)}$" and insert -- tr $\alpha$ $e^{(\Delta E/kT)}$ --, therefor.
Lines 32, 33, 35 and 36, delete "(A)" and insert -- (Å) --, therefor.
Line 43, insert -- $\alpha$ -- after "tr".

Column 12,
Line 34, delete "$t_{sense=}1ns$" and insert -- $t_{sense}=1ns$ --, therefor.
Line 65, delete "110" and insert -- I/O --, therefor.

Column 20,
Line 9, delete "regon" and insert -- region --, therefor.

Column 22,
Line 55, delete "laye" and insert -- layer --, therefor.

Column 23,
Line 15, delete "claim 64" and insert -- claim 66 --, therefor.

Column 24,
Line 58, delete "tunner" and insert -- tunnel --, therefor.

Signed and Sealed this

Twenty-ninth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,456,535 B2
DATED : September 24, 2002
INVENTOR(S) : Leonard Forbes et al.

It is certified that error appears in the above-identified patent and that said Letters Patent is hereby corrected as shown below:

Column 6,
Line 18, delete "tr $e^{(\Delta E/kT)}$" and insert -- tr $\propto e^{(\Delta E/kT)}$ --, therefor.
Lines 32, 33, 35 and 36, delete "(A)" and insert -- (Å) --, therefor.
Line 43, insert -- $\propto$ -- after "tr".

Column 12,
Line 34, delete "$t_{sense=}1ns$" and insert -- $t_{sense}=1ns$ --, therefor.
Line 65, delete "110" and insert -- I/O --, therefor.

Column 20,
Line 9, delete "regon" and insert -- region --, therefor.

Column 22,
Line 55, delete "laye" and insert -- layer --, therefor.

Column 23,
Line 15, delete "claim 64" and insert -- claim 66 --, therefor.

Column 24,
Line 58, delete "tunner" and insert -- tunnel --, therefor.

Signed and Sealed this

Sixth Day of May, 2003

JAMES E. ROGAN
*Director of the United States Patent and Trademark Office*